US010794957B2

(12) United States Patent
Yoon et al.

(10) Patent No.: US 10,794,957 B2
(45) Date of Patent: Oct. 6, 2020

(54) BATTERY MODULE AND CELL CONFIGURATION RECOGNITION SYSTEM FOR ID ASSIGNMENT (71) Applicant: LG Chem, Ltd., Seoul (KR)

(72) Inventors: Seung Kyu Yoon, Daejeon (KR); Hyun Jin Kim, Daejeon (KR)

(73) Assignee: LG Chem, Ltd. (KR)

(*) Notice: Subject to any disclaimer, the term of this patent is extended or adjusted under 35 U.S.C. 154(b) by 220 days.

(21) Appl. No.: 15/577,959

(22) PCT Filed: Dec. 12, 2016

(86) PCT No.: PCT/KR2016/014542
§ 371 (c)(1),
(2) Date: Nov. 29, 2017

(87) PCT Pub. No.: WO2017/105046
PCT Pub. Date: Jun. 22, 2017

(65) Prior Publication Data
US 2018/0149704 A1    May 31, 2018

(30) Foreign Application Priority Data

Dec. 17, 2015 (KR) .......................... 10-2015-0180659
Dec. 17, 2015 (KR) .......................... 10-2015-0180661

(51) Int. Cl.
*G01R 31/36* (2020.01)
*H04Q 9/00* (2006.01)
(Continued)

(52) U.S. Cl.
CPC ......... *G01R 31/3648* (2013.01); *G01R 19/00* (2013.01); *G01R 19/165* (2013.01);
(Continued)

(58) Field of Classification Search
CPC ..... H01M 10/4207; H01M 2010/4271; H01M 10/425; G01R 19/00; G01R 19/165; G01R 31/3648
See application file for complete search history.

(56) References Cited

U.S. PATENT DOCUMENTS 8,898,341 B2 * 11/2014 Kim ..................... G06F 13/42
710/4
8,963,507 B2 * 2/2015 Kim ..................... H04L 61/6004
320/162
(Continued)

FOREIGN PATENT DOCUMENTS

CN    104253469 A    12/2014
JP    2005149951 A    6/2005
(Continued)

OTHER PUBLICATIONS

Extended European Search Report for EP16875988 dated Mar. 29, 2018.
(Continued)

*Primary Examiner* — Mohamed Charioui
(74) *Attorney, Agent, or Firm* — Lerner, David, Littenberg, Krumholz & Mentlik, LLP (57) ABSTRACT The present invention relates to a battery module and cell configuration recognition system for ID assignment, and more specifically, to a battery module and cell configuration recognition system for ID assignment that recognizes the number of battery cells and battery modules connected in series in order to assign an ID to a BMS and a battery cell of each of the battery modules.

12 Claims, 5 Drawing Sheets (51) Int. Cl.
  *G01R 19/00* (2006.01)
  *H01M 10/42* (2006.01)
  *G01R 19/165* (2006.01)

(52) U.S. Cl.
  CPC ....... *G01R 19/16528* (2013.01); *G01R 31/36* (2013.01); *H01M 10/425* (2013.01); *H01M 10/4207* (2013.01); *H04Q 9/00* (2013.01); *H01M 2010/4271* (2013.01)

(56) References Cited

U.S. PATENT DOCUMENTS

| | | |
|---|---|---|
| 2011/0175574 A1 | 7/2011 | Sim et al. |
| 2012/0268069 A1* | 10/2012 | Park ................. H01M 10/4207 320/116 |
| 2014/0018990 A1 | 1/2014 | Kataoka et al. |
| 2014/0091769 A1* | 4/2014 | Kim .................... H04L 61/2038 320/134 |
| 2014/0115191 A1 | 4/2014 | Kim et al. |
| 2014/0347012 A1 | 11/2014 | Shim et al. |
| 2014/0365792 A1* | 12/2014 | Yun ....................... G06F 1/3212 713/320 |
| 2016/0178686 A1 | 6/2016 | Janardhan et al. |

FOREIGN PATENT DOCUMENTS

| | | |
|---|---|---|
| JP | 2008157808 A | 7/2008 |
| JP | 201134964 A | 2/2011 |
| JP | 2013165569 A | 8/2013 |
| JP | 2013541314 A | 11/2013 |
| JP | 2014527680 A | 10/2014 |
| JP | 2015008040 A | 1/2015 |
| JP | 2015505415 A | 2/2015 |
| KR | 20010055891 A | 7/2001 |
| KR | 20130033197 A | 4/2013 |
| KR | 20130053885 A | 5/2013 |
| KR | 20130100523 A | 9/2013 |
| KR | 20140055065 A | 5/2014 |
| KR | 20140139322 A | 12/2014 |
| KR | 20150037406 A | 4/2015 |
| KR | 101542094 B1 | 8/2015 |
| WO | 2012131797 A1 | 10/2012 |

OTHER PUBLICATIONS

Search report from International Application No. PCT/KR2016/014542, dated Mar. 14, 2017.

* cited by examiner

BATTERY MODULE AND CELL CONFIGURATION RECOGNITION SYSTEM FOR ID ASSIGNMENT

CROSS-REFERENCE TO RELATED APPLICATIONS

The present application is a national phase entry under 35 U.S.C. § 371 of International Application No. PCT/KR2016/014542, filed Dec. 12, 2016, which claims priority from Korean Patent Application No. 10-2015-0180659, filed on Dec. 17, 2015, and Korean Patent Application No. 10-2015-0180661, filed on Dec. 17, 2015, all of which are herein incorporated by reference.

TECHNICAL FIELD

The present invention relates to a system for recognizing battery module and cell configuration for identifier allocation, and more particularly, to a system for recognizing the number of battery modules connected in series to each other in order to allocate an ID to a BMS of each battery module or recognizing the number of battery cells connected in series to each other in order to allocate IDs to a plurality of battery cells included in each battery module.

BACKGROUND ART

In general, a plurality of battery modules having a plurality of battery cells are electrically connected to each other in series to constitute a battery pack.

The battery pack has a battery management system (BMS) for monitoring and controlling a state of the battery pack and battery modules included therein.

Furthermore, each battery module may also have a BMS for managing cells included therein.

Here, the BMS for managing the entirety of the battery pack is set as a master BMS, and the BMSs of the battery modules are set as slave BMSs.

According to the prior art, in the case where a battery pack includes two or more battery modules having the same voltage and connected in series, the BMS of the battery pack is unable to autonomously recognize the configuration of the battery modules, and thus the number of the battery modules should be manually input, and BMS S/W corresponding to the number of the battery modules should be developed and managed.

Accordingly, when allocating an ID to the BMS of each battery module to control the battery pack, the ID is allocated by manually inputting the number of the battery modules, causing inconvenience.

Furthermore, each battery module individually has a plurality of various battery cells, and an ID of each battery cell should also be allocated to control the battery pack.

Accordingly, when allocating a battery cell ID, the number of the battery cells included in each battery module should be manually input, and BMS S/W of each battery module corresponding to the number of the cells should be developed and managed.

When allocating IDs to the BMS of a battery module and each battery cell as described above, there occurs a problem in which the number of battery modules and the number of battery cells should be manually input and pieces of BMS S/W matched to the corresponding numbers should be stored.

DISCLOSURE OF THE INVENTION

Technical Problem

The present invention provides a system for recognizing battery module and cell configuration to allocate an ID, which is capable of resolving the inconvenience of manually inputting the number of battery modules and the number of battery cells when allocating IDs to battery modules and cells.

Technical Solution

A system for recognizing battery module and cell configuration to allocate an ID of a plurality of battery modules including a plurality of battery cells connected in series according to an embodiment of the present invention, wherein the battery module includes a battery module BMS configured to measure a module voltage of the battery module, wherein a battery pack BMS of a battery pack configured by connecting the plurality of battery modules in series includes: a measurement unit configured to measure a pack voltage of the battery pack; and a control unit configured to recognize number of connected battery modules on the basis of the module voltage measured by the battery module BMS and the pack voltage measured by the measurement unit of the battery pack to allocate an ID to each battery module BMS, wherein the system includes a memory configured to store the number of modules recognized by the control unit.

The control unit may include: a calculation unit configured to calculate the number of battery modules by dividing the pack voltage measured by the measurement unit of the battery pack by the module voltage measured by the battery module BMS; and an ID allocation unit configured to set the battery pack BMS as a master BMS, set the battery module BMS as a slave BMS, and allocate an ID of the slave BMS according to the number of battery modules stored in the memory.

The battery module BMS may further include a cell number calculation unit configured to calculate number of a plurality of battery cells included in the battery module.

The memory may store a voltage value of a single battery cell.

A method for recognizing battery module configuration to allocate an ID of a battery module including a plurality of battery cells according to another embodiment of the present invention includes: a battery module number recognizing step for measuring and performing an arithmetic operation on voltages of the battery module and a battery pack including a plurality of battery modules to recognize the number of battery modules included in the battery pack; and a BMS ID allocating step for allocating a master ID to a battery pack BMS and allocating a slave ID to each battery module BMS according to the recognized number of battery modules.

The battery module number recognizing step may include: a battery pack voltage measuring step for measuring a pack voltage on the battery pack; a battery module voltage measuring step for measuring a battery module voltage; and a measured voltage operating step for performing an arithmetic operation on the measured voltages of the battery pack and the battery module to recognize the number of battery modules.

In the measured voltage operating step, the number of battery modules may be calculated by dividing the measured pack voltage of the battery pack by the measured module voltage of the battery module.

The BMS ID allocating step may include: a master BMS setting step for setting, by the battery pack BMS, the battery pack BMS as a master BMS; and a slave BMS ID allocating step for sequentially allocating IDs to respective battery module BMSs according to the recognized number of battery modules.

The slave BMS ID allocating step may include: a first slave BMS ID allocating step for allocating k (k is a fixed number) as an ID to a first slave BMS; an ID allocation request signal transmitting step for transmitting, by the first slave BMS, an ID allocation request signal to a control unit so that (k+n), which is an ID, is successively allocated to a (n+1)th slave BMS (n is an integer equal to or larger than 1) when the ID is allocated to the first slave BMS; and a slave BMS ID allocation confirming step for comparing, by the control unit that has received the ID allocation request signal, the recognized number of battery modules with n+1 which represents an ID allocation number of the (n+1)th slave BMS for which ID allocation has been requested to confirm whether the number of allocated IDs matches the recognized number of battery modules.

In the slave BMS ID allocation confirming step, (k+n) may be allocated as an ID to the (n+1)th slave BMS when the recognized number of battery modules is equal to or larger than n+1.

A method for recognizing battery cell configuration to allocate an ID of a plurality of battery cells according to another embodiment of the present invention includes: a battery cell number recognizing step for measuring a voltage value of a battery module and recognizing number of a plurality of battery cells on the basis of the measured voltage value of the battery module; and a cell ID allocating step for allocating an ID to each battery cell according to the number of battery cells recognized in the battery cell number recognizing step.

The battery cell number recognizing step may include: a cell voltage value setting step for setting a voltage value of a single battery cell; a module voltage value measuring step for measuring a total voltage value of a battery module in which a plurality of cells are connected; and a cell number calculating step for calculating the number of battery cells included in the battery module from the total voltage value of the battery module and the voltage value of the single battery cell.

In the cell number calculating step, the number of battery cells connected in series in the battery module is calculated by dividing the total voltage value of the battery module measured in the module voltage value measuring step by the voltage of the single battery cell set in the cell voltage value setting step.

The cell ID allocating step may include: a first battery cell ID allocating step for allocating k (k is a fixed number) as an ID to a first battery cell; an ID allocation request signal transmitting step for transmitting, by the first battery cell, an ID allocation request signal to a control unit so that (k+n), which is an ID, is successively allocated to a (n+1)th battery cell (n is an integer equal to or larger than 1) when the ID is allocated to the first battery cell; and a battery cell ID allocation confirming step for comparing, by the control unit that has received the ID allocation request signal, the recognized number of battery cells with n+1 which represents an ID allocation number of the (n+1)th battery cell for which ID allocation has been requested to confirm whether the number of allocated IDs matches the recognized number of battery cells.

In the battery cell ID allocation confirming step, (k+n) may be allocated as an ID to the (n+1)th battery cell when the recognized number of battery cells is equal to or larger than n+1.

Advantageous Effects

A system for recognizing battery module and cell configuration to allocate an ID according to an embodiment of the present invention autonomously recognizes the number of battery modules connected in series to each other and the number of battery cells connected in series to each other when allocating IDs to battery module BMSs and battery cells, so that a battery pack may be operated with ease.

MODE FOR CARRYING OUT THE INVENTION

Hereinafter, embodiments of the present invention will be described in detail with reference to the accompanying drawings. However, the present invention is not restricted or limited by the embodiments. Rather, the embodiments are provided so that the disclosure of the present invention is thorough and complete and fully conveys the scope of the present invention to those skilled in the art.

The term "first", "second" or the like may be used for describing various elements but does not limit the elements. Such terms are only used for distinguishing one element from other elements. For example, without departing the scope of the present invention, a first element may be referred to as a second element, and likewise, a second element may be referred to as a first element. The terminology used herein is not for delimiting the present invention but for describing specific embodiments. The terms of a singular form may include plural forms unless otherwise specified.

The terms used herein have been selected from among general terms that are widely used at the present time in consideration of the functions of the present invention, but may be changed depending on intentions of those skilled in the art, judicial precedents, or the advent of new technology. Furthermore, specific terms have been arbitrarily selected by the applicant, and the meanings of such terms will be described in detail in relevant sections of the description. Therefore, it should be understood that the terms used herein should not be simply defined literally but should be defined on the basis of the meanings of the terms and the overall contents of the present invention.

1. System for Recognizing Battery Module and Cell Configuration to Allocate ID According to an Embodiment of the Present Invention A system for recognizing battery module and cell configuration to allocate an ID of the present invention autonomously calculates the number of arranged battery modules and allocates an ID of a BMS of each battery module using the calculated number.

Figure 1:
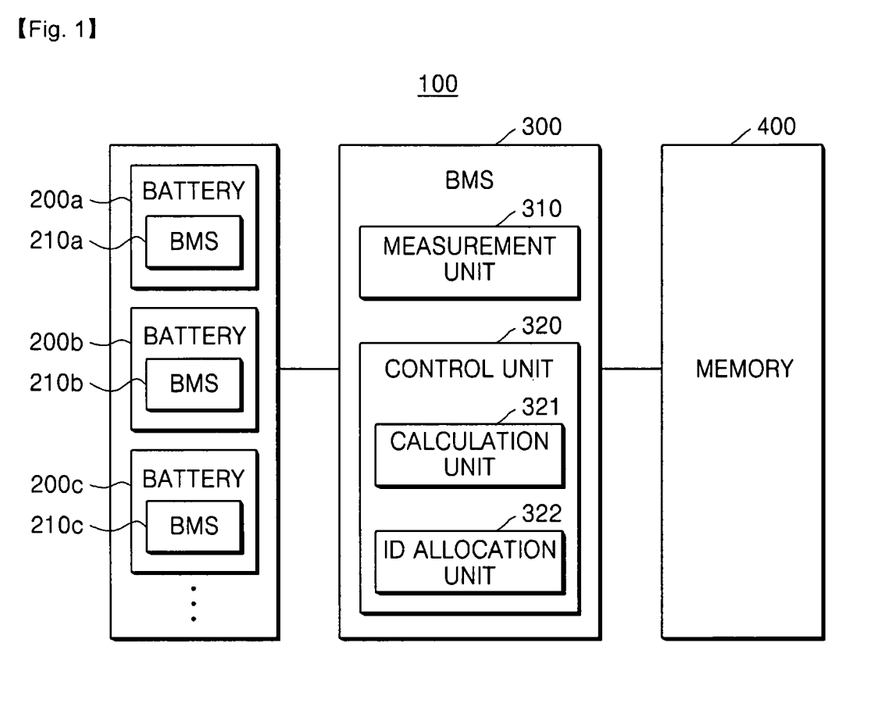
FIG. 1 is a configuration diagram illustrating a system for recognizing battery module and cell configuration to allocate an ID according to an embodiment of the present invention.

FIG. 1 is a configuration diagram illustrating a system for recognizing battery module and cell configuration to allocate an ID according to an embodiment of the present invention.

Referring to FIG. 1, a system for recognizing battery module and cell configuration to allocate an ID according to an embodiment of the present invention is included in a battery pack 100 including battery modules 200 (200a, 200b, 200c, . . . , 200n) including a plurality of battery cells, a battery pack BMS 300 which controls an entire battery pack and calculates the number of battery modules, and a memory 400 which stores the calculated number of battery modules.

In the case where at least two battery modules 200 including a plurality of battery cells exist, the battery modules 200b, 200c, . . . , 200n having the same configuration as the battery module 200a are electrically connected in series.

Furthermore, each battery module 200 includes a battery module BMS 210 (210a, 210b, . . . , 210n) which may measure a module voltage of a battery module and may be assigned with an ID to identify a battery module.

A voltage value of a single battery cell included in the battery module 400 may be preset and stored in the memory 400, and the single battery cell voltage value stored in the memory may be used as a reference value for calculating the number of cells in a cell number calculation unit (now shown) described below.

The battery module BMS 210 is described below in more detail.

The battery module BMS 210 additionally includes a cell number calculation unit (not shown) which calculates the number of battery cells included in a battery module, and the cell number calculation unit (not shown) may calculate the number of battery cells included in the corresponding battery module 400 by dividing a voltage of the battery module 400 measured by the battery module BMS 210 by the single cell voltage value stored in the memory 200.

Therefore, since the voltage value of a battery module in which battery cells are connected in series is equal to a sum of battery cell voltages, the number of serially connected battery cells included in the battery module may be identified by dividing the total voltage of the battery module by a single battery cell voltage if the battery cells included in the battery module are identical cells.

Furthermore, the battery module BMS 210 may be additionally provided with a module voltage measurement unit (not shown) outside the battery module BMS 210 to measure the total voltage of the battery module 400, or may be provided with a voltage measurement block in the battery module BMS 210 to measure the total voltage of the battery module 400.

Meanwhile, the battery pack BMS 300 includes a pack voltage measurement unit 310 which measures the total voltage of the battery pack and a control unit 320 which performs an arithmetic operation on the module voltage measured by the battery module BMS 210 and the pack voltage measured by the pack voltage measurement unit 310 and recognizes the number of the battery modules to allocate an ID to each battery module BMS 210 on the basis of the number of the battery modules.

In detail, the control unit 320 includes a calculation unit 321 which calculates the number of the battery modules by dividing the pack voltage measured by the pack voltage measurement unit 310 by the module voltage measured by the battery module BMS 210 and an ID allocation unit 322 which sets the battery pack BMS 300 as a master BMS and allocates an ID to each battery module BMS 210 as a slave BMS according to the number calculated by the calculation unit 321. Here, the measured module voltage of a battery module is obtained by arbitrarily measuring a single battery module.

Meanwhile, the memory 400 may store the voltage measured by the battery module BMS 210 and the voltage measured by the battery pack BMS 300, and may also store the number of battery modules calculated by the calculation unit 321 and the number of battery cells calculated by the cell number calculation unit (not shown).

2. Method for Recognizing Battery Module Configuration to Allocate ID According to an Embodiment of the Present Invention According to a method for recognizing battery module configuration to allocate an ID of the present invention, the number of battery modules may be recognized by performing an arithmetic operation on a measured pack voltage of a battery pack and a measured module voltage of a battery module, and an ID may be allocated to each battery module BMS according to the recognized number of battery modules.

Figure 2:
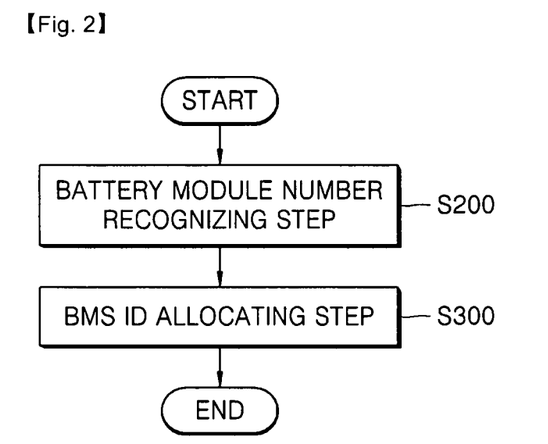
FIG. 2 is a flowchart illustrating a method for recognizing battery module configuration to allocate an ID according to an embodiment of the present invention.

FIG. 2 is a flowchart illustrating a method for recognizing battery module configuration to allocate an ID according to an embodiment of the present invention.

Referring to FIG. 2, according to a method for recognizing battery module configuration to allocate an ID according to an embodiment of the present invention, a module voltage of a battery module including a plurality of battery cells connected in series and a pack voltage of a battery pack may be measured, and the battery pack may autonomously recognize the number of battery modules by performing an arithmetic operation on the measured values (battery module number recognizing step S200). Here, the recognized number of battery modules may be stored in a memory.

Furthermore, the method includes a BMS ID allocating step S300 for allocating a required ID to each battery module BMS according to the recognized number of battery modules to identify each battery module when controlling the battery pack.

The above-mentioned steps are described below in more detail with reference to FIGS. 3 and 5.

The battery module number recognizing step S200 is described below in detail with reference to FIG. 3.

Figure 3:
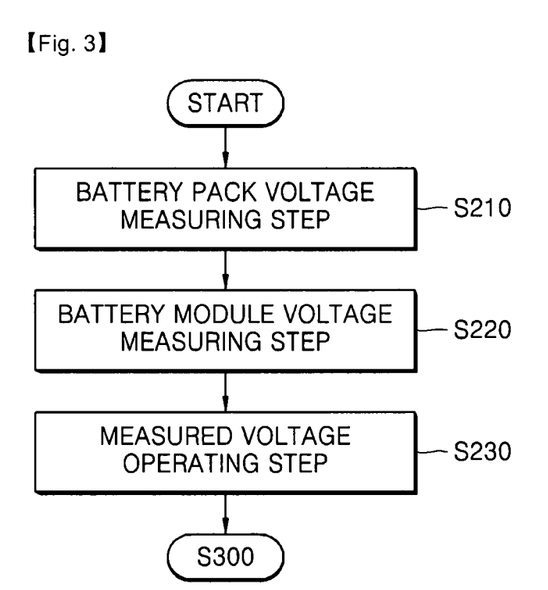
FIG. 3 is a flowchart illustrating a battery module number recognizing step of a method for recognizing battery module configuration to allocate an ID according to an embodiment of the present invention.

FIG. 3 is a flowchart illustrating the battery module number recognizing step S200 of the method for recognizing battery module configuration to allocate an ID according to an embodiment of the present invention.

Referring to FIG. 3, in the battery module number recognizing step S200, the pack voltage of a battery pack is measured (battery pack voltage measuring step S210). Furthermore, the module voltage of an arbitrarily selected single battery module is measured (battery module voltage measuring step S220).

The control unit 320 recognizes the number of battery modules by performing an arithmetic operation on the measured battery pack voltage and the measured battery module voltage (measured voltage operating step S230). Here, the number of battery modules may be derived by dividing the measured battery pack voltage by the measured battery module voltage.

For example, the number of battery modules is calculated through equation of number of battery modules=(measured pack voltage)/(measured module voltage).

The recognized number of battery modules may be applied to an algorithm for allocating a size of battery module data received by a battery pack BMS and an algorithm for allocating a BMS ID required for controlling operation of a battery pack.

The BMS ID allocating step S300 is described below in detail with reference to FIG. 4.

Figure 4:
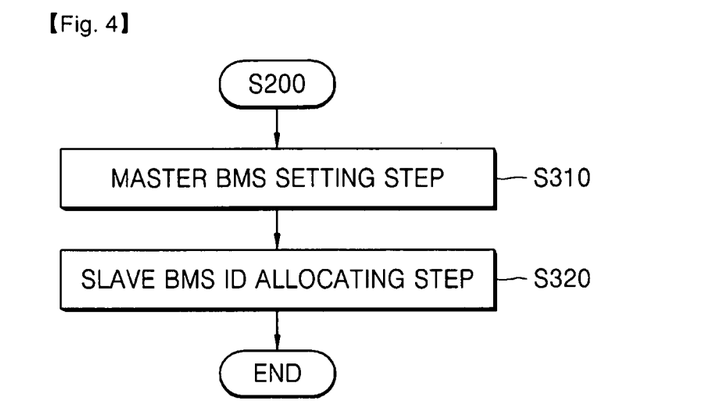
FIG. 4 is a flowchart illustrating a BMS ID allocating step of a method for recognizing battery module configuration to allocate an ID according to an embodiment of the present invention.

FIG. 4 is a flowchart illustrating the BMS ID allocating step S300 of the method for recognizing battery module configuration to allocate an ID according to an embodiment of the present invention.

Referring to FIG. 4, the BMS ID allocating step S300 includes a master BMS setting step S310 for setting a battery pack BMS as a master BMS and a slave BMS ID allocating step S320 for allocating slave-type IDs to respective battery module BMSs by using the number of battery modules calculated in the measured voltage operating step S230.

Here, the master BMS may transmit a battery module control command through communication with each slave BMS to which an ID has been allocated, and may receive data obtained by the slave BMSs.

The slave BMS ID allocating step S320 is described below in detail with reference to FIG. 5.

Figure 5:
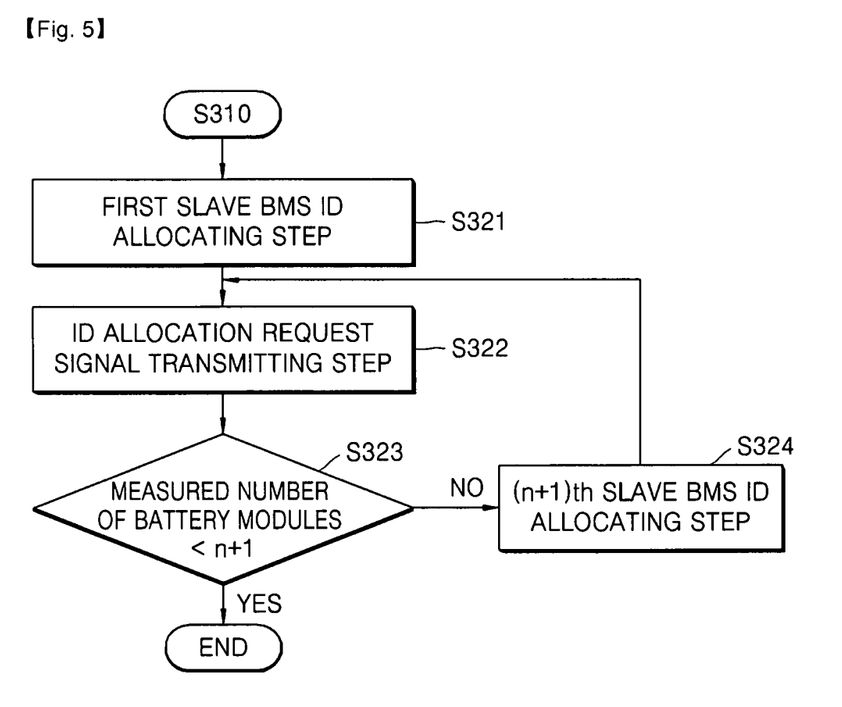
FIG. 5 is a flowchart illustrating a slave BMS ID allocating step of a method for recognizing battery module configuration to allocate an ID according to an embodiment of the present invention.

FIG. 5 is a flowchart illustrating the slave BMS ID allocating step S320 of the method for recognizing battery module configuration to allocate an ID according to an embodiment of the present invention.

Referring to FIG. 5, since the battery pack 100 includes the plurality of battery modules 200, k is allocated as an ID to a first slave BMS (first slave BMS ID allocating step S321). Here, the first slave BMS represents a slave BMS to which an ID is firstly allocated, and IDs are sequentially allocated to other battery module BMSs.

Therefore, regarding an nth slave BMS, 'n' represents the number of BMSs to which IDs are currently allocated.

The nth slave BMS to which an ID has been allocated, transmits an ID allocation request signal to the control unit so that (k+n), which is an ID, is allocated to a next slave BMS, i.e., a (n+1)th slave BMS (ID allocation request signal transmitting step S322).

Upon receiving the ID allocation request signal, the control unit 320 compares the number of battery modules stored in the memory 400 with n+1 which represents an ID allocation number of the (n+1)th slave BMS for which next ID allocation has been requested. The control unit 320 determines whether the stored number of battery modules is equal to or larger than the number of IDs to be allocated (slave BMS ID allocation confirming step S323).

Here, when the recognized number of battery modules is smaller than n+1, the control unit 320 recognizes that IDs have been allocated to all the battery module BMSs and terminates a corresponding algorithm.

When the recognized number of battery modules is equal to or larger than n+1, (k+n) is allocated as an ID to the (n+1)th slave BMS, and the ID allocation request signal for allocating (k+n+1) as an ID to a (n+2)th slave BMS is generated ((n+1)th slave BMS ID allocating step S324).

3. Method for Recognizing Battery Cell Configuration to Allocate ID According to an Embodiment of the Present Invention According to a method for recognizing battery cell configuration to allocate an ID of the present invention, the number of battery cells included in a single battery module may be recognized by performing an arithmetic operation on a preset cell voltage of a battery cell and a measured module voltage of a battery module, and an ID of each battery cell may be allocated according to the recognized number of battery cells.

Figure 6:
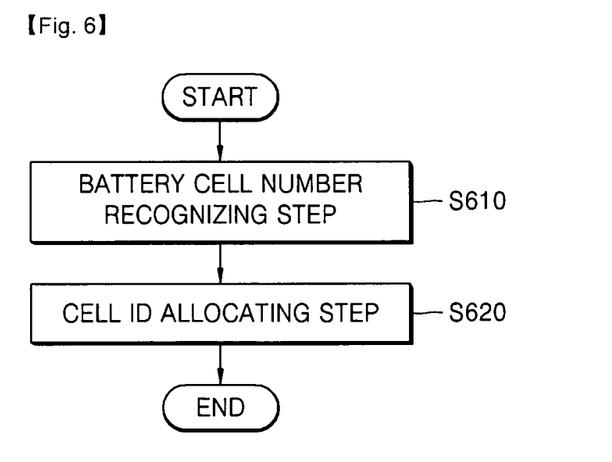
FIG. 6 is a flowchart illustrating a method for recognizing battery cell configuration to allocate an ID according to an embodiment of the present invention.

FIG. 6 is a flowchart illustrating a method for recognizing battery cell configuration to allocate an ID according to an embodiment of the present invention.

Referring to FIG. 6, according to a method for recognizing battery cell configuration to allocate an ID according to an embodiment of the present invention, a voltage value of a battery module may be measured, and the number of battery cells connected in series may be recognized on the basis of the measured voltage value of the battery module (battery cell number recognizing step S610). Here, the recognized number of battery cells may be stored in a memory.

Furthermore, in the battery cell number recognizing step S610, an ID is allocated to each battery cell according to the recognized number of battery cells (cell ID allocating step S620).

The battery cell number recognizing step is described below in more detail with reference to FIG. 7.

Figure 7:
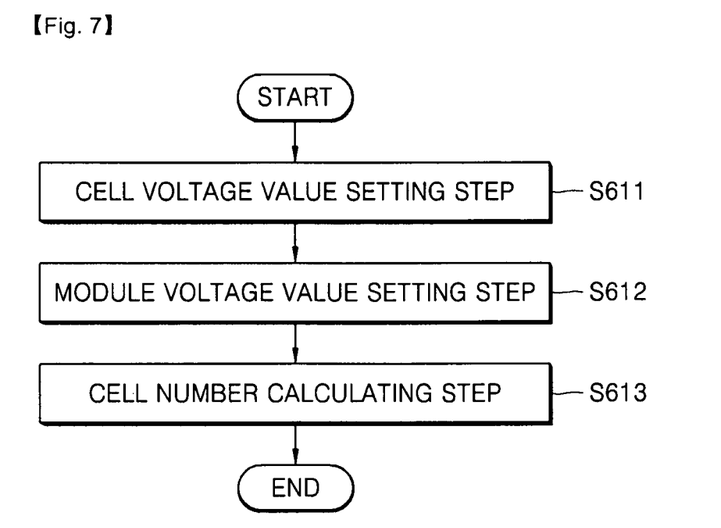
FIG. 7 is a flowchart illustrating a battery cell number recognizing step of a method for recognizing battery cell configuration to allocate an ID according to an embodiment of the present invention.

FIG. 7 is a flowchart illustrating the battery cell number recognizing step S610 of the method for recognizing battery cell configuration to allocate an ID according to an embodiment of the present invention.

Referring to FIG. 7, in the battery cell number recognizing step S610, a voltage value of a single battery cell is set (cell voltage value setting step S611), and a total voltage value of a battery module in which a plurality of cells are connected in series is measured (module voltage value measuring step S612).

Thereafter, the number of battery cells included in the battery module is calculated from the total voltage value of the battery module and the voltage value of the single battery cell (cell number calculating step S613). Here, the number of battery cells may be derived by dividing the measured module voltage value of the battery module by the set cell voltage value of a battery cell.

For example, the number of battery cells is calculated through equation of number of battery cells=(measured module voltage)/(set cell voltage).

BMS software corresponding to the calculated number of battery cells may be selected through the battery module BMS 210.

In the cell voltage value setting step S611, the cell voltage value may be set using a voltage value prestored in the memory 400 or may be set by actually measuring a voltage of a single battery cell.

The cell ID allocating step S620 is described below in more detail.

k (k is a fixed number) is allocated as an ID to a first battery cell (first battery cell ID allocating step), and once the ID is allocated to the first battery cell, the first battery cell transmits an ID allocation request signal to the control unit so that (k+n), which is an ID, is sequentially allocated to a (n+1)th battery cell (n is an integer equal to or larger than 1)

(ID allocation request signal transmitting step). Here, the first battery cell represents a battery cell to which an ID is firstly allocated, and IDs are sequentially allocated to other battery cells.

Therefore, regarding an nth battery cell, 'n' represents the number of battery cells to which IDs are allocated.

The control unit that has received the ID allocation request signal determines whether the number of allocated IDs matches the recognized number of battery cells by comparing the recognized number of battery cells with (n+1) which represents an ID allocation number of the (n+1)th battery cell for which ID allocation has been requested (battery cell ID allocation confirming step).

Here, the control unit may represent the control unit 320 included in the battery pack, or may represent a control unit separately configured to allocate an ID to each battery module.

Therefore, in the case where IDs are allocated through the control unit 320 of the battery pack, ID k has different values for different battery modules so that IDs of battery cells do not overlap with each other.

When the recognized number of battery cells is smaller than n+1, the control unit recognizes that IDs have been allocated to all the battery cells and terminates a corresponding algorithm.

When the recognized number of battery cells is equal to or larger than n+1, (k+n) is allocated as an ID to the (n+1)th battery cell, and the ID allocation request signal for allocating (k+n+1) as an ID to a (n+2)th battery cell is generated.

Although the technical concept of the present invention has been specifically described according to the above-mentioned embodiment, it should be noted that the above-mentioned embodiment is not for limiting the present invention but for describing the present invention. Furthermore, those skilled in the art can make various embodiments within the scope of the claims.

What is claimed is:

1. A system for determining battery module and cell configuration to allocate an ID of a plurality of battery modules of a battery pack connected in series, each battery module comprising a plurality of battery cells connected in series, wherein each the plurality of battery modules comprises a battery module BMS, the system comprising:
    a battery pack BMS comprising:
        a measurement unit configured to measure a pack voltage of the battery pack; and
        a control unit configured to determine a number of battery modules included in the battery pack based on a module voltage measured by one battery module BMS, and the pack voltage measured by the measurement unit of the battery pack BMS; and
    a memory configured to store the number of battery modules included in the battery pack determined by the control unit,
    wherein the control unit is further configured to:
        allocate an ID to each battery module BMS, beginning with a first slave BMS, and then continuing to each subsequent slave BMS, wherein each subsequent slave BMS is allocated an ID in response to receiving an ID allocation request signal from a slave BMS to which an ID was previously assigned, wherein each ID allocation request signal includes an ID to be assigned to the subsequent slave BMS;
        for each received ID allocation request signal, compare the ID included in the ID allocation request signal with the number of battery modules stored in the memory; and
        terminate allocating an ID to each battery module BMS upon determining that the ID included in the ID allocation request signal corresponds to a number of battery modules equal to or greater than the number of battery modules stored in the memory.

2. The system of claim 1, wherein the control unit comprises:
    a calculation unit configured to calculate the number of battery modules by dividing the pack voltage measured by the measurement unit of the battery pack BMS by the module voltage measured by the one battery module BMS; and
    an ID allocation unit configured to set the battery pack BMS as a master BMS.

3. The system of claim 1, wherein the battery module BMS further comprises a cell number calculation unit configured to calculate a number of battery cells included in the battery module.

4. The system of claim 3, wherein the memory is configured to store a voltage value of a single battery cell, wherein the cell number calculation unit is configured to calculate a number of battery cells included in the battery module based on the module voltage of the battery module and the stored voltage value.

5. A method for determining battery module configuration to allocate an ID of a battery module of a battery pack, the battery module comprising a plurality of battery cells, the method comprising:
    a battery module number determining step for determining a number of battery modules included in the battery pack, based on a module voltage measured by a BMS of the battery module, and based on a pack voltage measured by a measurement unit of a battery pack BMS;
    a battery module number storing step for storing the number of battery modules included in the battery pack determined in the battery module determining step in a memory; and
    a BMS ID allocating step for allocating a master ID to the battery pack BMS and allocating a slave ID to the battery module BMS according to the determined number of battery modules;
    wherein allocating a slave ID to the battery module BMS comprises:
        allocating an ID to each battery module BMS, beginning with a first slave BMS, and then continuing to each subsequent slave BMS, wherein each subsequent slave BMS is allocated an ID in response to receiving an ID allocation request signal from a slave BMS to which an ID was previously assigned, wherein each ID allocation request signal includes an ID to be assigned to the subsequent slave BMS;
        for each received ID allocation request signal, comparing the ID included in the ID allocation request signal with the number of battery modules stored in the memory; and
        terminating allocating an ID to each battery module BMS upon determining that the ID included in the ID allocation request signal corresponds to a number of battery modules equal to or greater than the number of battery modules stored in the memory.

6. The method of claim 5, wherein the battery module number determining step comprises:
    a battery pack voltage measuring step for measuring a pack voltage on the battery pack;
    a battery module voltage measuring step for measuring a battery module voltage; and a measured voltage operating step for performing an arithmetic operation on the measured voltages of the battery pack and the battery module to determine the number of battery modules.

7. The method of claim 6, wherein, in the measured voltage operating step, the number of battery modules is calculated by dividing the measured pack voltage of the battery pack by the measured module voltage of the battery module.

8. The method of claim 5, wherein allocating a slave ID to the battery module BMS further comprises:
a first slave BMS ID allocating step for allocating k (k is a fixed number) as an ID to a first slave BMS;
an ID allocation request signal transmitting step for transmitting, by the first slave BMS, an ID allocation request signal to a control unit so that (k+n), which is an ID, is successively allocated to a (n+1)th slave BMS (n is an integer equal to or larger than 1) when the ID is allocated to the first slave BMS; and
a slave BMS ID allocation confirming step for comparing, by the control unit that has received the ID allocation request signal, the determined number of battery modules with n+1 which represents an ID allocation number of the (n+1)th slave BMS for which ID allocation has been requested to confirm whether the number of allocated IDs matches the determined number of battery modules.

9. The method of claim 8, wherein, in the slave BMS ID allocation confirming step, (k+n) is allocated as an ID to the (n+1)th slave BMS when the determined number of battery modules is equal to or larger than n+1.

10. A method for determining battery cell configuration to allocate an ID of a plurality of battery cells of a battery module connected in series, the method comprising:
a battery cell number determining step for measuring a voltage value of the battery module and determining a number of battery cells included in the battery module based on the measured voltage value of the battery module; and
a cell ID allocating step for allocating an ID to each battery cell according to the number of battery cells determined in the battery cell number determining step,
wherein the cell ID allocating step comprises:
a first battery cell ID allocating step for allocating k (k is a fixed number) as an ID to a first battery cell;
an ID allocation request signal transmitting step for transmitting, by the first battery cell, an ID allocation request signal to a control unit so that (k+n), which is an ID, is successively allocated to a (n+1)th battery cell (n is an integer equal to or larger than 1) when the ID is allocated to the first battery cell; and
a battery cell ID allocation confirming step for comparing, by the control unit that has received the ID allocation request signal, the determined number of battery cells with n+1 which represents an ID allocation number of the (n+1)th battery cell for which ID allocation has been requested to confirm whether the number of allocated IDs matches the determined number of battery cells.

11. The method of claim 10, wherein the battery cell number determining step comprises:
a cell voltage value setting step for setting a voltage value of a single battery cell;
a module voltage value measuring step for measuring a total voltage value of the battery module in which the plurality of battery cells are connected; and
a cell number calculating step for calculating the number of battery cells included in the battery module from the total voltage value of the battery module and the voltage value of the single battery cell.

12. The method of claim 10, wherein, in the battery cell ID allocation confirming step, (k+n) is allocated as an ID to the (n+1)th battery cell when the determined number of battery cells is equal to or larger than n+1.

* * * * *